United States Patent
Sato

(10) Patent No.: US 8,330,194 B2
(45) Date of Patent: Dec. 11, 2012

(54) SUBSTRATE FOR SEMICONDUCTOR DEVICE INCLUDING AN ISLAND-SHAPED UNDERLYING FILM OVERLAPPING A TRANSISTOR, METHOD OF MANUFACTURING THE SAME, SEMICONDUCTOR DEVICE AND ELECTRONIC DEVICE

(75) Inventor: Takashi Sato, Chino (JP)

(73) Assignee: Seiko Epson Corporation, Tokyo (JP)

( * ) Notice: Subject to any disclaimer, the term of this patent is extended or adjusted under 35 U.S.C. 154(b) by 138 days.

(21) Appl. No.: 12/941,258

(22) Filed: Nov. 8, 2010

(65) Prior Publication Data

US 2011/0114971 A1 May 19, 2011

(30) Foreign Application Priority Data

Nov. 13, 2009 (JP) ................................. 2009-259954

(51) Int. Cl.
*H01L 31/062* (2012.01)
(52) U.S. Cl. .......... 257/291; 257/292; 257/293; 257/72; 257/59; 438/478; 438/149
(58) Field of Classification Search ............... 257/59, 257/72, 291, 292, E29.117, E29.202, E29.273
See application file for complete search history.

(56) References Cited

U.S. PATENT DOCUMENTS

| 6,593,661 | B2 * | 7/2003 | Kanayama | 257/774 |
|---|---|---|---|---|
| 6,850,000 | B1 * | 2/2005 | Huang et al. | 313/500 |
| 6,897,909 | B2 * | 5/2005 | Ochiai et al. | 349/43 |
| 7,696,689 | B2 * | 4/2010 | Lee et al. | 313/509 |
| 7,880,203 | B2 * | 2/2011 | Miyasaka et al. | 257/291 |
| 2004/0126940 | A1 * | 7/2004 | Inoue | 438/149 |
| 2009/0184314 | A1 | 7/2009 | Aoki et al. | |
| 2009/0200609 | A1 * | 8/2009 | Miyasaka et al. | 257/347 |

FOREIGN PATENT DOCUMENTS

JP 2009-176828 A 8/2009

* cited by examiner

*Primary Examiner* — Marc Armand
*Assistant Examiner* — Bilkis Jahan
(74) *Attorney, Agent, or Firm* — AdvantEdge Law Group, LLC

(57) ABSTRACT

A substrate for a semiconductor device is provided, including: a substrate; a transistor, formed on the substrate, that includes a semiconductor layer, and a gate electrode disposed so as to be opposed to the semiconductor layer with a gate insulating film interposed therebetween; and an underlying film disposed below the semiconductor layer, as an underlayer of the transistor, and formed in an island shape so as to at least partially overlap the semiconductor layer, in a plan view of the substrate.

7 Claims, 5 Drawing Sheets

SUBSTRATE FOR SEMICONDUCTOR DEVICE INCLUDING AN ISLAND-SHAPED UNDERLYING FILM OVERLAPPING A TRANSISTOR, METHOD OF MANUFACTURING THE SAME, SEMICONDUCTOR DEVICE AND ELECTRONIC DEVICE

BACKGROUND

1. Technical Field

The present invention relates to a substrate for a semiconductor device, a method of manufacturing the same, a semiconductor device including the substrate for the semiconductor device, and an electronic device including the semiconductor device.

2. Related Art

An example of the substrate for the semiconductor device of this type includes an active matrix substrate, used in a display device such as, for example, an active matrix driving-type electrophoretic display device, which includes, on a substrate, a pixel electrode, and a thin film transistor (TFT) as a scan line, a data line and a pixel switching element for performing selective driving of this pixel electrode. In such an active matrix substrate, there may be a case where an underlying insulation film is provided on the substrate in order to planarize the irregularities existing on the surface of the substrate, and to effectively block degassing from the substrate, or gas, moisture and the like intruding from the outside through the substrate with respect to various types of elements, interconnections and the like formed on the substrate. For example, JP-A-2009-176828 discloses a technique for forming the underlying film over the entire surface of the substrate.

However, there is a technical problem that is caused by the fact that when the underlying insulation film is formed over the entire surface of the substrate as disclosed in JP-A-2009-176828, flexure may occur in the substrate due to stress generated within the underlying insulation film in the formation steps thereof.

SUMMARY

An advantage of some aspects of the invention is that it provides, for example, a substrate for a semiconductor device including a transistor on a substrate, which is capable of suppressing flexure in the substrate while meeting demands for resource saving and cost reduction, a method of manufacturing the same, a semiconductor device including such a substrate for the semiconductor device, and an electronic device including such a semiconductor device.

According to a first aspect of the invention, a substrate for a semiconductor device is provided, including: a substrate; a transistor, formed on the substrate, that includes a semiconductor layer, and a gate electrode disposed so as to be opposed to the semiconductor layer with a gate insulating film interposed therebetween; and an underlying film disposed below the semiconductor layer, as an underlayer of the transistor, and formed in an island shape so as to at least partially overlap the semiconductor layer, in a plan view of the substrate.

The substrate for the semiconductor device according to an aspect of the invention is used as an active matrix substrate in, for example, a display device such as an active matrix driving-type electrophoretic display device, and includes the transistor on the substrate.

A "transistor" according to an aspect of the invention includes a semiconductor layer, a gate insulating film and a gate electrode. The gate electrode is formed so as to be opposed to a channel region of a semiconductor layer with the gate insulating film interposed therebetween. That is, the gate insulating film electrically insulates the semiconductor layer and the gate electrode from each other.

Meanwhile, the transistor may be a top gate type in which the gate electrode is disposed above the semiconductor layer in the laminated structure formed on the substrate, may be a bottom gate type in which the gate electrode is disposed below the semiconductor layer in the laminated structure formed on the substrate, and may be double gate type in which the gate electrode is disposed both above and below the semiconductor layer.

An "underlying film" according to an aspect of the invention is formed below the semiconductor layer, as an underlayer of the transistor, and is formed in an island shape so as to at least partially overlap the semiconductor layer, in a plan view of the substrate. Here, "formed in an island shape" according to an aspect of the invention means local formation in one specific region located on the substrate by, for example, an application method, and in effect excludes formation over the entire surface of the substrate, as well as formation over the entire surface of the substrate in the manufacturing process. As seen from the above, the underlying film is formed in the region to be formed on the substrate by the application method. According to an aspect of the invention, particularly, the region in which the underlying film is formed is a region which at least partially overlaps the semiconductor layer. Since the semiconductor layer is easily influenced by degassing from the substrate, or gas, moisture and the like intruding from the outside through the substrate, the underlying film is formed below the semiconductor layer in order to protect the semiconductor layer.

To describe further, the underlying film does not need to be formed in the region in which interconnections and elements, not easily influenced by degassing from the substrate, or gas, moisture and the like intruding from the outside through the substrate, are disposed. It is possible to considerably suppress the amount of material required for forming the underlying film by forming the underlying film in an island shape except for the region in which such an underlying film does not need to be formed. As a result, it is possible to realize a substrate for a semiconductor device which meets demands for resource saving and cost reduction.

In addition, it is possible to suppress flexure of the substrate generated when the underlying film is formed over the entire surface of the substrate, by forming the underlying film in an island shape. For example, when a plurality of transistors is included on the substrate, the underlying film is also formed in an island shape for each semiconductor layer included in each of the transistors. In this case, since stress generated in the individual underlying films is much smaller than stress generated when the underlying film is formed over the entire surface of the substrate, it is also possible to make flexure in the substrate much smaller.

As described above, with the substrate for the semiconductor device according to an aspect of the invention, it is possible to effectively suppress flexure in the substrate while meeting demands for resource saving and cost reduction, by forming the underlying film in an island shape.

In the substrate for the semiconductor device according to another aspect of the invention, it is preferable that the underlying film is formed so that the central portion thereof is thinner than the edge thereof, in a plan view of the substrate.

According to the above-mentioned aspect, it is possible to form a laminated structure having sizes and positions with a good degree of accuracy on the underlying film. For example, when one film is formed on the underlying film having such a shape by an application method, the formed film is stably disposed on the underlying film. If the thickness of the underlying film is constant (that is, if the surface of the underlying film is flat), there may be a concern that the film after application is easily deviated on the underlying film, to thereby cause the size and position thereof to be inaccurate. On the other hand, in the aspect, the underlying film is formed so that the central portion thereof is thinner than the edge thereof, in a plan view of the substrate. That is, since the surface of the underlying film has a concave central portion, the film after application is substantially fixed so as to fit into the concave portion. For this reason, the film after patterning is accurately patterned and formed, and is disposed at the accurate position on the underlying film even after application. As a result, the position and the size in the laminated structure formed on the underlying film can be controlled with a good degree of accuracy, and thus a high-grade substrate for the semiconductor device can be realized.

In the configuration formed so that the surface of the underlying film mentioned above is concave, it is preferable that the gate electrode is disposed above the semiconductor layer and that the underlying film is formed more widely than the semiconductor layer, in a plan view of the substrate.

In this case, the transistor formed on the substrate is a so-called top gate-type transistor in which the gate electrode is disposed above the semiconductor layer. In this case, the semiconductor layer is formed on the underlying film. Since the surface of the underlying film has a concave central portion as described above, the semiconductor layer formed on the above-mentioned underlying film can have a size and a position with a good degree of accuracy.

Further, in the configuration formed so that the surface of the underlying film mentioned above is concave, it is preferable that the gate electrode is disposed below the semiconductor layer and that the underlying film is formed more widely than the gate electrode, in a plan view of the substrate.

In this case, the transistor formed on the substrate is a so-called bottom gate-type transistor in which the gate electrode is disposed below the semiconductor layer. In this case, the gate electrode is formed on the underlying film. Since the surface of the underlying film has a concave central portion as described above, the gate electrode formed on the above-mentioned underlying film can have a size and a position with a good degree of accuracy.

According to a second aspect of the invention, a method of manufacturing a substrate for a semiconductor device including a transistor having a semiconductor layer, a gate insulating film and a gate electrode on a substrate is provided, including: forming the semiconductor layer; forming the gate insulating film between the semiconductor layer and the gate electrode; forming the gate electrode so as to be opposed to the semiconductor layer with the gate insulating film interposed therebetween; and forming an underlying film in an island shape, as an underlayer of the transistor, below the semiconductor layer so as to at least partially overlap the semiconductor layer, in a plan view of the substrate.

According to such an aspect of the invention, it is possible to manufacture the substrate for the semiconductor device (however, including various types of aspects thereof) of the invention mentioned above. Here, particularly, it is possible to effectively suppress flexure in the substrate while meeting demands for resource saving and cost reduction, by including forming the underlying film in an island shape, as an underlayer of the transistor, below the semiconductor layer so as to at least partially overlap the semiconductor layer, in a plan view of the substrate.

In an aspect of the method of manufacturing the substrate for the semiconductor device according to an aspect of the invention, the forming of the underlying film includes forming the underlying film by applying an insulating material to a region in which the underlying film on the substrate is formed.

According to the aspect, it is possible to form the underlying film in an island shape by applying an insulating material to a region to be formed on the substrate by, for example, an ink jet method and the like. As seen from the above, since the underlying film is formed by applying the material, in a limited way, not to the entire surface of the substrate, but to a specific region, useless material does not occur. In other words, it is possible to manufacture a substrate for the semiconductor device having a high-performance transistor while meeting demands for resource saving and cost reduction as well.

According to a third aspect of the invention, a semiconductor device including the substrate for the semiconductor device (however, including various types of aspects thereof) of the invention mentioned above is provided.

With the semiconductor device according an aspect of the invention, the substrate for the semiconductor device of the invention mentioned above is provided, and therefore, it is possible to realize various types of display devices such as, for example, an electrophoretic display device, a liquid crystal display device, an organic EL (electro-luminescence) display device, an electrochromic display device, and an electrowetting display device which are capable of performing, for example, a high-grade display.

According to a third aspect of the invention, an electronic device including the semiconductor device (however, including various types of aspects thereof) of the invention mentioned above is provided.

The electronic device according to an aspect of the invention includes the semiconductor device of the invention mentioned above, and therefore, it is possible to realize an electrophoretic device such as, for example, an electronic paper, a field emission display and a conduction electron-emitter display which are capable of performing, for example, a high-quality image display, a DLP (Digital Light Processing) as device using the electrophoretic device, the field emission display and the conduction electron-emitter display, and the like. In addition, it is also possible to realize, as the electronic device according to another aspect of the invention, various types of electronic devices such as a projection type display device, a television, a cellular phone, an electronic diary, a word processor, a viewfinder type or monitor direct-view-type video tape recorder, a workstation, a television telephone, a POS terminal, a touch panel, an sensor formed on the surface of artificial dermis, and the like.

The operations and the other advantages of the invention will be obvious from embodiments described below.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the drawings. The embodiments below take, as an example, an active matrix driving-type electrophoretic display panel which is an example of a semiconductor device according to the invention, including an active matrix substrate which is an example of a substrate for the semiconductor device according to the invention.
Electrophoretic Display Panel

First Embodiment

The electrophoretic display panel according to the first embodiment will be described with reference to FIGS. 1 to 5.

First, the whole configuration of the electrophoretic display panel according to the embodiment will be described with reference to FIGS. 1 and 2.

Figure 1:
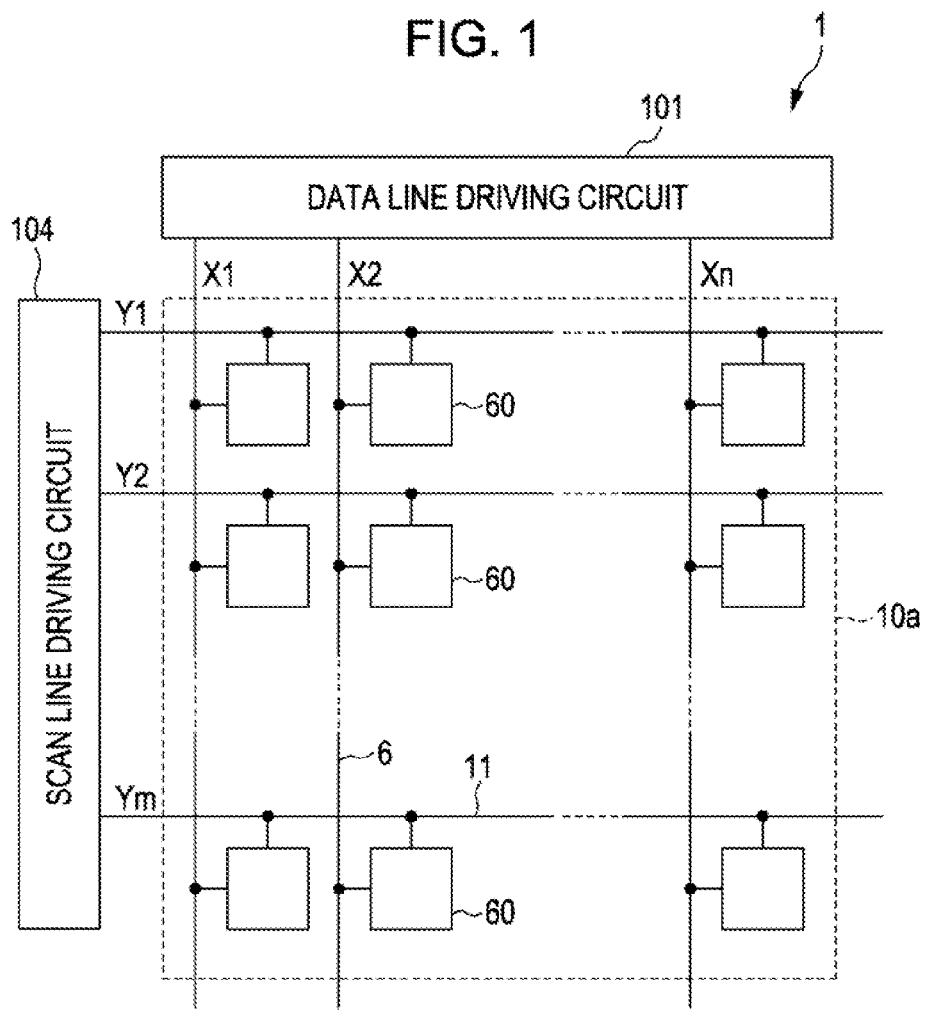
FIG. 1 is a block diagram illustrating the whole configuration of an electrophoretic display panel according to a first embodiment.

FIG. 1 is a block diagram illustrating the whole configuration of the electrophoretic display panel according to the embodiment.

In FIG. 1, an electrophoretic display panel 1 according to the embodiment has a display portion 10a in which pixels 60 of m columns×n rows are arranged in a matrix shape (two-dimensionally). Here, m scan lines 11 (that is, scan lines Y1, Y2, . . . , Ym) and n data lines 6 (that is, data lines X1, X2, . . . , Xn) are provided to the display portion 10a so as to intersect each other. The m scan lines 11 extend in the row direction (that is, X direction), and n data lines 6 extend in the column direction (that is, Y direction). The pixels 60 are disposed so as to correspond to the intersection of m scan lines 11 and n data lines 6.

The electrophoretic display panel 1 includes a scan line driving circuit 104 and a data line driving circuit 101 for supplying a scan signal and an image signal required for driving these pixels 60.

The scan line driving circuit 104 sequentially supplies the scan signal to each of the scan lines Y1, Y2, . . . , Ym in a pulse manner. On the other hand, the data line driving circuit 101 supplies the image signal to the data lines X1, X2, . . . , Xn so as to be synchronized with supply timing of the scan signal from the scan line driving circuit 104. The image signal takes a binary level of a high-potential level (hereinafter, referred to as a "high level", for example, 5 V) or a low-potential level (hereinafter, referred to as a "low level", for example, 0 V).

Meanwhile, in the embodiment, although the scan line driving circuit 104 and the data line driving circuit 101 are embedded in the electrophoretic display panel, they may be provided to the outside as an external IC attached to the COF (chip on film) and the like.

Figure 2:
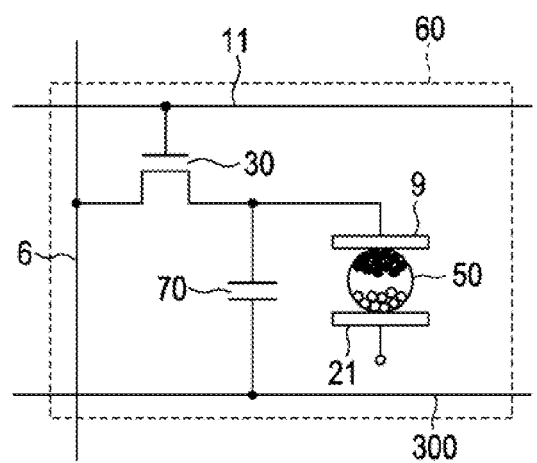
FIG. 2 is a circuit diagram of a pixel of the electrophoretic display panel according to the first embodiment.

FIG. 2 is a circuit diagram of one pixel 60 in the display portion 10a of the electrophoretic display panel 1 according to the embodiment.

In FIG. 2, the pixel 60 is configured so that an electrophoretic element 50 is interposed between a pixel electrode 9 and an opposite electrode 21 which are formed, respectively, on the surfaces of a pair of substrates (that is, an element substrate and an opposite substrate described later) disposed so as to be opposed to each other, thereby allowing the gradation display to be performed. Meanwhile, the element substrate (however, including a laminated structure formed on the substrate) on which the pixel electrode 9 is formed makes up an active matrix substrate as an example of the "substrate for the semiconductor device" according to the invention.

Here, the electrophoretic element 50 is composed of a plurality of microcapsules including, respectively, electrophoretic particles. The microcapsule is configured such that dispersion mediums, a plurality of white particles, and a plurality of black particles are sealed, for example, in the inside of a coated film. The coated film functions as an outer shell of the microcapsule, and is formed of an acrylic resin such as polymethacrylic acid methyl and polymethacrylic acid ethyl, a urea resin, and a polymeric resin having light-transmitting properties such as gum arabic. The dispersion medium is a medium for dispersing the white particles and the black particles in the microcapsule (in other words, inside the coated film). The dispersion medium includes, for example, water, an alcoholic solvent (such as methanol, ethanol, isopropanol, butanol, octanol, and methyl cellosolve), various types of esters (such as ethyl acetate and butyl acetate), ketones (such as acetone, methylethyl ketone, and methylisobutyl ketone), aliphatic hydrocarbon (such as pentane, hexane, and octane), alicyclic hydrocarbon (such as cyclohexane and methylcyclohexane), aromatic hydrocarbon (such as benzenes having benzene, toluene, or a long-chain alkyl group (such as xylene, hexyl benzene, heptyl benzene, octyl benzene, nonyl benzene, decyl benzene, undecyl benzene, dodecyl benzene, tridecyl benzene, and tetradecyl benzene)), halogenated hydrocarbon (such as chloride methylene, chloroform, tetrachloride carbon, and 1,2-dichloroethane), carboxylic acid salt, or oils other than these. These materials can be used alone or in combination. In addition, a surfactant may be blended with the dispersion medium. The white particle is, for example, a particle (macromolecule or colloid) containing a white pigment such as titanium dioxide, zinc oxide, and antimony trioxide, and is, for example, negatively charged. The black particle is, for example, a particle (macromolecule or colloid) containing a black pigment such as aniline black and carbon black, and is, for example, positively charged. For this reason, the white particle and the black particle can travel through the dispersion medium due to an electric field generated by the potential difference between the pixel electrode 9 and the opposite electrode 21.

Meanwhile, these pigments can be added with, as necessary, a charge-controlling agent containing particles such as an electrolyte, a surfactant, a metallic soap, a resin, rubber, oil, a varnish, and a compound, a dispersing agent such as a titanium-based coupling agent, an aluminum-based coupling agent, and a silane-based coupling agent, a lubricant agent, a stabilizing agent and the like.

Each of the pixels 60 includes a pixel switching TFT 30 and a holding capacitor 70. Meanwhile, the TFT 30 is an example of a "transistor" according to the invention.

The TFT 30 is configured such that a gate thereof is electrically connected to the scan line 11, a source thereof is electrically connected to the data line 6, and a drain thereof is connected to the pixel electrode 9. The TFT 30 outputs the image signal, supplied from the data line driving circuit 101 (see FIG. 1) through the data line 6, to the pixel electrode 9, at the timing in response to the scan signal supplied from the scan line driving circuit 104 (see FIG. 1) through the scan line 11 in a pulse manner.

The holding capacitor 70 is formed by interposing a capacitor insulating film 72 between a pair of electrodes (in particular, a capacitor electrode 71 and a relay layer 8 described later with reference to FIG. 5). Here, one electrode (particularly, the relay layer 8 described later) of a pair of electrodes is electrically connected to the drain of the TFT 30 and the pixel electrode 9, and the other electrode (particularly, the capacitor electrode 71 described later) is electrically connected to the common potential line 300 held at a predetermined potential. Here, the potential of the common potential line 300 may be a constant value, and may fluctuate at a constant or inconstant period. As seen from the above, it is possible to improve the holding characteristics for the image signal of the pixel electrode 9 by providing the holding capacitor 70 in parallel to the pixel 60. Meanwhile, when the holding characteristics of the pixel can be sufficiently secured even in the case of no holding capacitor 70, the holding capacitor 70 may not be provided.

Figure 3:
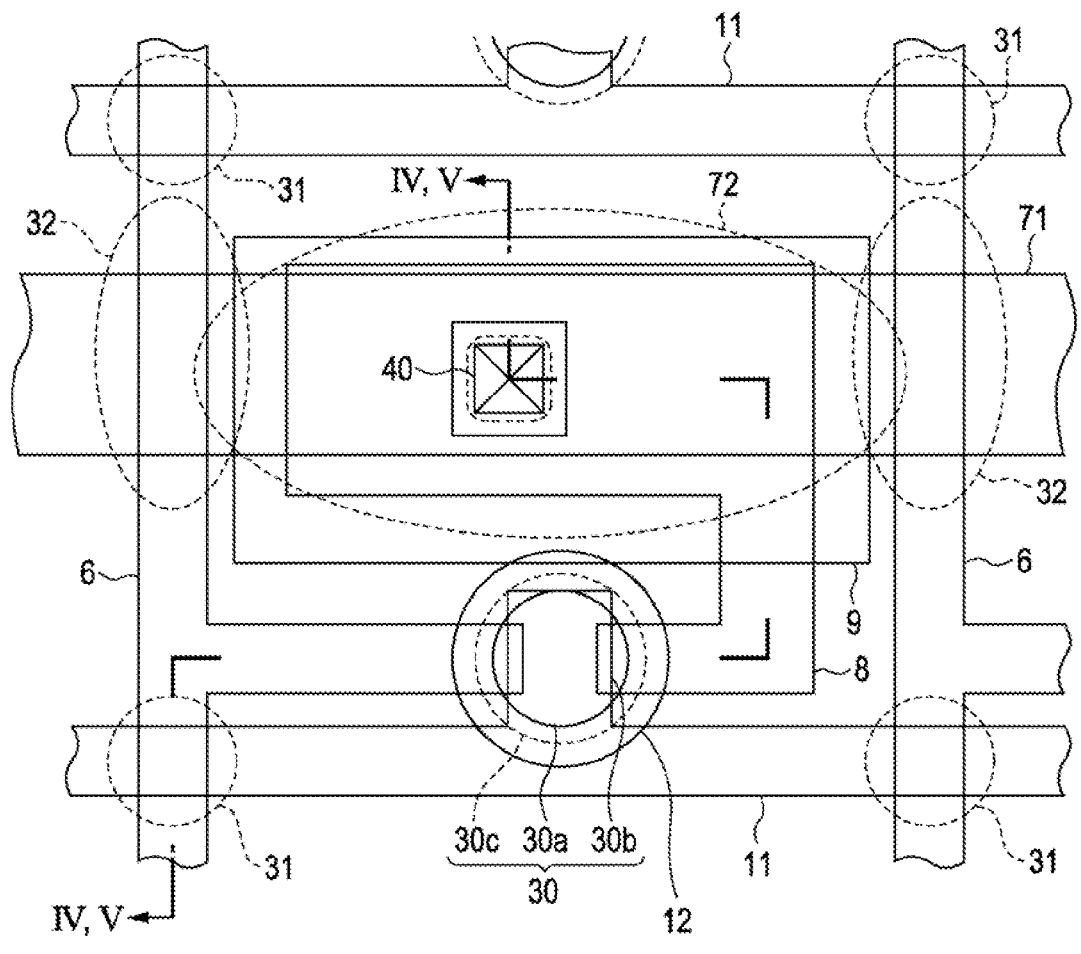
FIG. 3 is an enlarged plan view of the display portion of the electrophoretic display panel according to the first embodiment.
Figure 4:
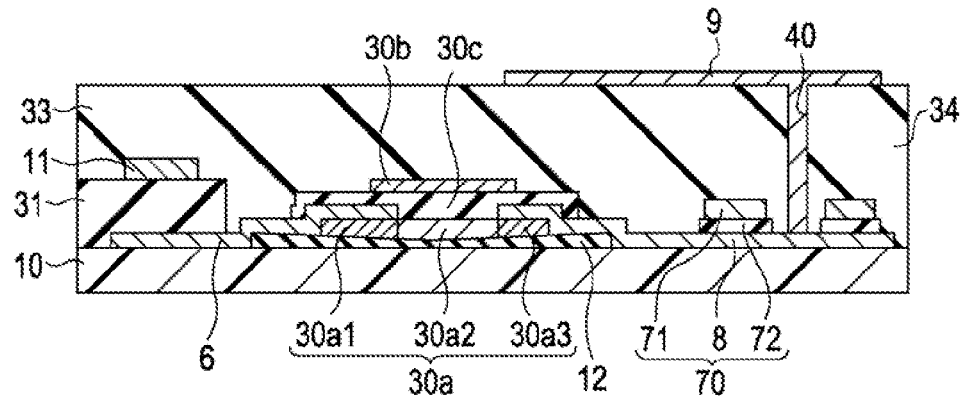
FIG. 4 is a cross-sectional view taken along the line IV-IV of FIG. 3.

Next, reference is made to FIGS. 3 and 4 to describe the specific configuration of the display portion 10a of the electrophoretic display panel 1 according to the embodiment.

FIG. 3 is an enlarged plan view of the display portion 10a of the electrophoretic display panel 1 according to the embodiment. FIG. 4 is a cross-sectional view taken along the line IV-IV of FIG. 3. Meanwhile, in FIGS. 3 and 4, since each layer and each member are set to sizes recognizable on the drawings, the scales thereof are set differently from each other for each layer and each member.

In FIG. 4, an element substrate 10 is an example of a "substrate" according to the invention, and is a substrate formed using polyethylene terephthalate (PET) having a thickness of 0.5 mm as a material. Meanwhile, a material of the element substrate 10 may include, for example, polyether sulfone (PES), polyetherimide, polyether ketone, polyphenylene sulfide, polyarylate, polyimide, polycarbonate (PC), aromatic polyester (liquid crystal polymer), cellulose triacetate (TAC), cellulose acetate propionate (CAP) and the like. When such an organic insulating substrate is adopted as the element substrate 10, it is possible to contribute to the weight reduction or the improvement in the flexibility of the electrophoretic display panel. In addition, an inorganic insulating substrate such as glass, silicon and a metallic thin plate may be used as a material of the element substrate 10. The plate thickness is not limited to 0.5 mm.

An underlying insulation film 12, made of polyimide, having a thickness of 100 nm which is an example of an "underlying film" according to the invention is formed on the surface of the element substrate 10 in an island shape. In other words, the underlying insulation film 12 is formed by applying an insulating material through an application method such as, for example, an ink jet method so as to include a region in which a semiconductor layer 30a is formed, in a plan view of the element substrate 10.

As a material of the underlying insulation film 12, it is possible to adopt, for example, an inorganic material such as an organic insulating material or a silicon nitride film, in addition to the above-mentioned polyimide. It is possible to planarize the irregularities existing on the surface of the element substrate 10 and to effectively block degassing from the element substrate 10, or gas, moisture and the like intruding from the outside through the element substrate 10, by forming the underlying insulation film 12, and thus it is possible to form a good-quality laminated structure on the upper layer side.

As shown in FIGS. 3 and 4, the underlying insulation film 12 is formed in an island shape over a wider range than that of the semiconductor layer 30a described later, and is formed so that the edge of the underlying insulation film has a larger film thickness than that of the central portion thereof (that is, in a mortar shape of which the central portion is concave). It is possible to stably form a laminated structure on the underlying insulation film 12 by setting the thickness of the underlying insulation film 12 like this. As will be described in further detail in a manufacturing method mentioned later, the semiconductor layer 30a disposed on the underlying insulation film 12 can be formed with a good degree of accuracy regarding the size and the position in the embodiment.

Here, the underlying insulation film 12 is formed in an island shape not over the entire surface of the element substrate 10, but over a slightly wider region than the semiconductor layer 30a. It is possible to suppress the amount of material required for forming the underlying insulation film 12, compared to the case where the underlying insulation film is formed over the entire surface, by partially forming it over one region on the element substrate 10 like this. That is, it is possible to effectively meet demands for resource saving and cost reduction.

Some of components such as the scan line 11 and the relay layer 8 are formed in the regions in which the underlying insulation film 12 is not formed on the surface of the element substrate 10. These are interconnections, elements and the like which are slightly or hardly influenced even by exposure to degassing from the element substrate 10 or gas, moisture and the like intruding from the outside through the element substrate 10. Conversely, disadvantages do not occur in the regions in which such interconnections, elements and the like are formed even when the underlying insulation film 12 does not exist. The formation of the underlying insulation film 12 over the entire surface of the element substrate 10 causes the underlying insulation film 12 to be formed even in the originally nonessential regions, resulting in inefficiency from a viewpoint of material saving and cost reduction. In the embodiment, since the underlying insulation film 12 is formed only in the essential regions with the exception of the regions lacking a need to form such an underlying insulation film 12, this is suitable for demands for resource saving and cost reduction.

The TFT 30 is formed on the underlying insulation film 12. The TFT 30 is disposed for each pixel so as to correspond to intersection of the scan line 11 formed to extend in the X direction and the data line 6 formed to extend in the Y direction, in a plan view of the element substrate 10. The TFT 30 is constituted by the semiconductor layer 30a, a gate electrode 30b and a gate insulating film 30c. Meanwhile, the TFT 30 in the embodiment is a so-called top gate type transistor in which the semiconductor layer 30a, the gate insulating film 30c and the gate electrode 30b are laminated in order from the lower layer side.

The semiconductor layer 30a is formed on the underlying insulation film 12. The semiconductor layer 30a includes a source region 30a1, a channel region 30a2 and a drain region 30a3, and the channel region 30a2 is provided so as to be opposed to the gate electrode 30b with the gate insulating film 30c interposed therebetween. Meanwhile, in the semiconductor layer 30a, an LDD region may be formed between the source region 30a1 and the channel region 30a2, or between the channel region 30a2 and the drain region 30a3.

The semiconductor layer 30a is formed using pentacene having a thickness of 50 nm as a material. Meanwhile, another material of the semiconductor layer 30a may include a low-molecular-weight organic semiconductor material such as naphthalene, anthracene, tetracene, hexacene, phthalocyanine, perylene, hydrazone, triphenylmethane, diphenylmethane, stilbene, arylvinyl, pyrazoline, triphenylamine, triarylamine, oligothiophene or a derivative thereof, and a high-molecular organic semiconductor material such as poly-N-vinylcarbazole, polyvinylpyrene, polyvinylanthracene, polythiophene, polyhexylthiophene, poly(p-phenylenevinylene), polythinylenevinylene, polyarylamine, a pyrene-formaldehyde resin, an ethylcarbazole-formaldehyde resin, a fluorene-bithiophene copolymer, a fluorene-arylamine copolymer or a derivative thereof. These materials may be used alone or in combination of two or more thereof. In addition, an oxide semiconductor such as IGZO, ZnO, $TiO_2$, and AlZnSnO or an inorganic semiconductor material such as silicon may be used as a material of the semiconductor layer 30a.

The film thickness of the semiconductor layer 30a is not limited to 50 nm, and may be in the range of 5 nm to 1 μm. At that time, when the film thickness thereof is thinner than that of the edge of the underlying film 12, the semiconductor layer is easily received in the concave inside of the underlying film.

The gate insulating film 30c, made of polyimide, having a thickness of 200 nm is formed above the semiconductor layer 30a. Another material of the gate insulating film 30c may include, for example, polyvinyl acetate, polymethyl methacrylate, polystyrene, polyimide, polyamide, polyester, polyacrylate, a photo-radical polymerizing-based and photo-cation polymerizing-based photocuring resin, polyvinyl phenol, polyvinyl alcohol, a novolak resin, cyanoethyl pullulan, a fluorine-based polymer, or a polyolefin-based polymer represented by polyisobutylene, PVP-OTS, and a copolymer thereof, or an organic insulating material such as a photosensitive resin, or an inorganic material such as a silicon oxide and a silicon nitride.

In the embodiment, particularly, the gate insulating film 30c is formed over a wider range than that of the semiconductor layer 30a, in a plan view of the element substrate 10, so as to cover the semiconductor layer 30a from the upper layer side. It is possible to protect the semiconductor layer 30a from the impurities or the charges intruding from the upper layer side into the semiconductor layer 30a, by covering the semiconductor layer 30a from the upper side with the gate insulating film 30c in this manner. In other words, it is possible to protect the semiconductor layer 30a, disposed at the upper layer side, from the impurities and the charges and the like intruding from the lower layer side (that is, element substrate 10 side) into the semiconductor layer 30a by the above-mentioned underlying insulation film 12, and to protect the semiconductor layer 30a, disposed at the upper layer side, from the impurities and the charges and the like intruding from the upper layer side into the semiconductor layer 30a by the gate insulating film 30c.

Here, the gate insulating film 30c may be formed so as to have a small film thickness and may be formed by adopting a material having a large specific dielectric constant as a material, from a viewpoint of improving the performance of the TFT 30. In the embodiment, particularly, the thickness of the gate insulating film 30c may be set to be in the range of 10 nm to 1 um or so.

The gate electrode 30b, made of aluminum (Al), having a thickness of 100 nm is formed above the gate insulating film 30c so as to be opposed to the channel region 30a2 of the semiconductor layer 30a. Here, as shown in FIG. 3, the gate electrode 30b is formed as a portion of the scan line 11 formed on the element substrate 10. In the embodiment, the portion of the scan line 11 formed so as to partially protrude in the Y direction functions as the gate electrode 30b at one region overlapping the semiconductor layer 30a, in a plan view of the element substrate 10, in the scan line 11 formed mainly along the X direction.

Here, the data line 6, made of gold (Au), having a thickness of 100 nm is electrically connected to the source region 30a1 in the semiconductor layer 30a. As shown in FIG. 4, the data line 6 is formed so that the portion thereof is interposed between the semiconductor layer 30a and the gate insulating film 30c. In addition, the relay layer 8 is electrically connected to the drain region 30a3. As shown in FIG. 4, the relay layer 8 is also formed so that a portion thereof is interposed between the semiconductor layer 30a and the gate insulating film 30c.

It is known that when an organic semiconductor material such as pentacene is used in the semiconductor layer 30a, the source region 30a1 and the drain region 30a2 are spontaneously formed in the semiconductor layer 30a which is in contact with the data line 6 and the relay layer 8. It is not necessary to perform introduction of the impurities, and the like. It can be said that when the Fermi levels of the semiconductor material and the metal carriers are approximately identical with each other, the charges flow spontaneously.

The materials of the gate electrode 30b and the data line 6 may be, for example, metallic materials such as gold, copper, aluminum, etc. and an alloy thereof, and may be organic conductive materials such as carbon nanotube, graphene, and PEDOT (polyethylene dioxithiophene). The film thicknesses of the gate electrode 30b and the data line 6 are preferably in the range of 5 mm to 50 um or so.

Figure 5:
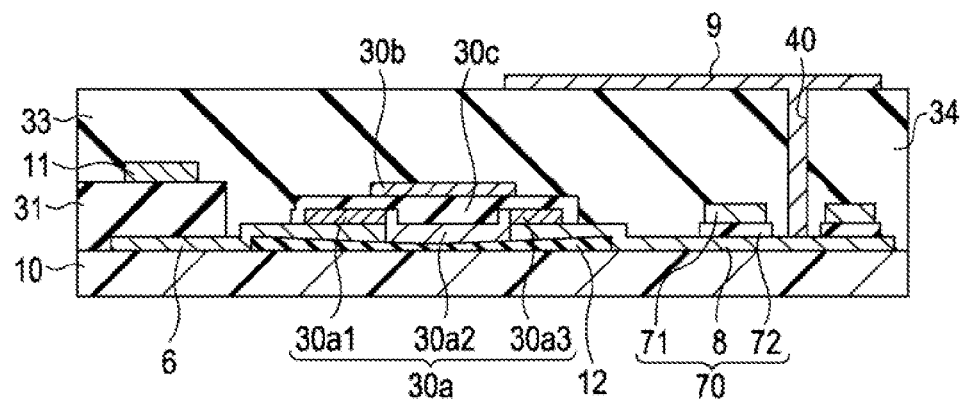
FIG. 5 is another example of a cross-sectional view taken along the line V-V of FIG. 3.

Meanwhile, as shown in FIG. 5, the data line 6 and the relay layer 8 are formed so that each of the portions thereof is interposed between the semiconductor layer 30a and the underlying insulation film 12, and thus the portions may be formed so as to be electrically connected to the source region 30a1 and the drain region 30a3, respectively. FIG. 5 is another example of a cross-sectional view taken along the line V-V of FIG. 3, and has the same purport as that of FIG. 4.

Returning again to FIGS. 3 and 4, a portion of the data line 6 is directly formed on the surface of the element substrate 10. That is, in the aforementioned region, the underlying insulation film 12 is not formed on the surface of the element substrate 10. Here, the data line 6 is slightly or hardly influenced even by exposure to the impurities or the charges and the like from the element substrate 10, from the standpoint of the properties thereof. In other words, those which are originally little influenced by the impurities and the charges and the like from the element substrate 10 side, among the elements and the interconnections formed on the element substrate 10 in this manner, may be disposed in the region in which the underlying insulation film 12 is not formed. As a result, since the underlying insulation film 12 does not need to be formed in such a region, it is possible to meet demands for resource saving and cost reduction by reducing the amount of material for forming the underlying insulation film 12. At the same time, it is also possible to effectively reduce flexure of the element substrate 12 which is generated when the underlying insulation film 12 is formed over the entire surface of the element substrate 10.

The scan line 11 is provided on the upper layer side of the data line 6 with an interlayer insulating film 31, made of acryl, having a thickness of 1 μm interposed therebetween. As shown in FIG. 4, the data line 6 and the scan line 11 are formed so as to extend in the X direction and the Y direction element, respectively, in a plan view of the element substrate 10.

A material of the interlayer insulating film 31 may include, for example, polyvinyl acetate, polymethyl methacrylate, polystyrene, polyimide, polyamide, polyester, polyacrylate, a photo-radical polymerizing-based and photo-cation polymerizing-based photocuring resin, polyvinyl phenol, polyvinyl alcohol, a novolak resin, cyanoethyl pullulan, a fluorine-based polymer, or a polyolefin-based polymer represented by polyisobutylene, PVP-OTS, and a copolymer thereof, an organic insulating material such as a photosensitive resin, and an inorganic material such as a silicon oxide and a silicon nitride.

The relay layer 8 is also configured such that a portion thereof is directly formed on the surface of the element substrate 10, similarly to the data line 6. That is, while the underlying insulation film 12 is not formed in the aforementioned region, the relay layer 8 is slightly or hardly influenced even by exposure to the impurities or the charges and the like from the element substrate 10 and thus no problem occurs. Since the underlying insulation film 12 does not need to be formed over the entire surface of the element substrate 10 even in this region, it is possible to reduce the amount of material for forming the underlying insulation film 12, to meet demands for resource saving and cost reduction, and to effectively reduce flexure of the element substrate 12 which is generated when the underlying insulation film 12 is formed over the entire surface of the element substrate 10 as well.

Further, the relay layer 8 is electrically connected to the pixel electrode 9, made of ITO, having a thickness of 50 nm with a contact hole 40 formed in interlayer insulating films 33 and 34 of the upper layer side, made of acryl, having a thickness of 1 μm. As seen from the above, the image signal supplied to the source region 30a1 is output from the drain region 30a3 at the timing (that is, timing at which the TFT 30 is driven to turn on) at which the scan signal is supplied to the gate electrode 30b, and thus a laminated structure is formed so that the image signal is applied to the pixel electrode 9 through the relay layer 8.

In addition, the relay layer 8 forms the holding capacitor 70 together with the capacitor electrode 71 formed on the upper layer side with the capacitor insulating film 72, made of polyimide, having a thickness of 200 nm interposed therebetween. The capacitor electrode 71 is electrically connected to the common potential line 300 (see FIG. 2) to thereby be held at a predetermined potential. Thereby, it is possible to effectively improve the holding characteristics of the TFT 30.

The interlayer insulating films 33 and 34 and the capacitor insulating film 72 can be formed using the same material as that of the gate insulating film 30c or the interlayer insulating film 31. The thicknesses of the interlayer insulating films 33 and 34 may be set to be in the range of 100 nm to 10 μm, and the thickness of the capacitor insulating film 72 can be set to be in the range of 5 nm to 1 μm.

The material of the pixel electrode 9 is not limited to ITO. Another transparent electrode or a non-transparent electrode such as metal may be used. The film thickness can be set to be in a range of 5 nm to 1 μm.

As described above, according to the electrophoretic display panel 1 of the embodiment, the underlying insulation film 12 is formed in an island shape in the region in which the semiconductor layer 30a is formed on the element substrate 10, thereby allowing flexure of the element substrate 10 to be reduced while meeting demands for resource saving and cost reduction. Further, it is possible to form the gate electrode 30b, disposed on the aforementioned surface, with a good degree of accuracy, by forming the surface of the underlying insulation film 12 in a mortar shape.

Second Embodiment

Figure 6:
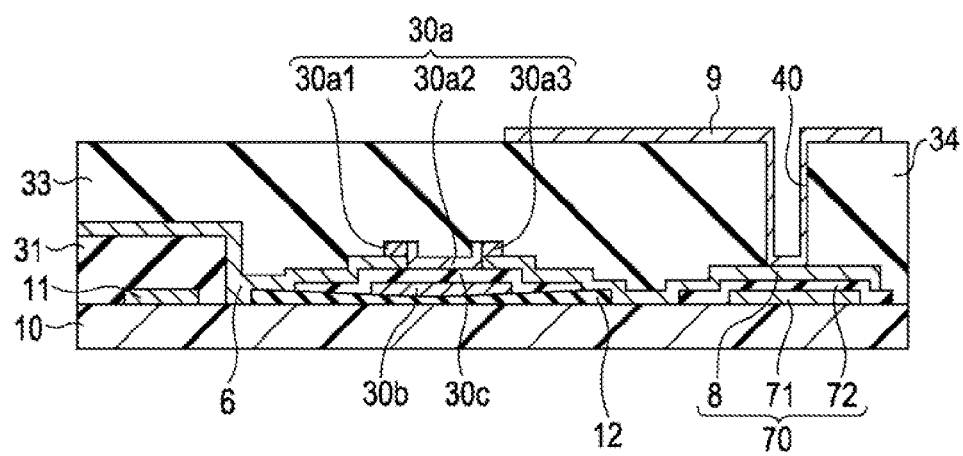
FIG. 6 is a cross-sectional view of the display portion of the electrophoretic display panel according to a second embodiment.

Subsequently, the configuration of an electrophoretic display panel according to a second embodiment will be described with reference to FIG. 6. Meanwhile, the electrophoretic display panel according to the second embodiment has schematically the same structure as that of the electrophoretic display panel, described basically, according to the first embodiment. For this reason, description of the points in common with the first embodiment mentioned above will be not repeated, and description will be made focusing on the points different therefrom.

The TFT 30 according to the embodiment is a so-called bottom gate type transistor in which the gate electrode 30b, the gate insulating film 30c and the semiconductor layer 30a are laminated in order from the lower layer side.

The gate electrode 30b is directly formed on the surface of the underlying insulation film 12 formed on the surface of the element substrate 10. Here, the underlying insulation film 12 is formed in an island shape over the wider range than that of the region in which the TFT 30 is formed, and is formed so that the edge of the underlying insulation film has a large film thickness than that of the central portion thereof (that is, in a mortar shape of which the central portion is concave). It is possible to form the gate electrode 30b on the surface of the underlying insulation film 12 with a good degree of accuracy by setting the thickness of the underlying insulation film 12 like this.

Here, since the underlying insulation film 12 is formed in an island shape not over the entire surface of the element substrate 10, but over a slightly wider region than the TFT 30, it is possible to suppress the amount of material required for forming the underlying insulation film 12, compared to the case where the underlying insulation film is formed over the entire surface of the element substrate 10. That is, it is possible to effectively meet demands for resource saving and cost reduction.

Some of the interconnections and the elements, such as the data line 6, the scan line 11, the capacitor electrode 71 and the relay layer 8, which are slightly or hardly influenced even by exposure to the impurities or the charge and the like from the element substrate 10 are formed in the regions in which the underlying insulation film 12 is not formed on the surface of the element substrate 10. Conversely, since the underlying insulation film 12 is not needed in the regions in which such interconnections and elements and the like are formed, it is inefficient to form the underlying insulation film 12 over the entire surface of the element substrate 10 as mentioned above. In the embodiment, since the underlying insulation film 12 is formed only in the essential regions with the exception of the regions lacking a need to form such an underlying insulation film 12, this is suitable for demands for resource saving and cost reduction.

The data line 6 is formed in the upper layer side of the scan line 11 with the interlayer insulating film 31 interposed therebetween. The data line 6 is formed so that the portion thereof is interposed between the gate insulating film 30c and the semiconductor layer 30a to thereby be electrically connected to the source region 30a1.

The relay layer 8 is formed so that the portion thereof is interposed between the gate insulating film 30c and the semiconductor layer 30a to thereby be electrically connected to the drain region 30a3. The relay layer 8 is also configured such that another portion thereof is electrically connected to the pixel electrode 9 with the contact hole 40 formed in the interlayer insulating films 33 and 34 of the upper layer side interposed therebetween. As seen from the above, the image signal supplied to the source region 30a1 is output from the drain region 30a3 at the timing (that is, timing at which the TFT 30 is driven to turn on) at which the scan signal is supplied to the gate electrode 30b, and thus a laminated structure is formed so that the image signal is applied to the pixel electrode 9 through the relay layer 8.

In addition, the relay layer 8 forms the holding capacitor 70 together with the capacitor electrode 71 formed on the lower layer side with the capacitor insulating film 72 interposed therebetween. The capacitor electrode 71 is electrically connected to the common potential line 300 (see FIG. 2) to thereby be held at a predetermined potential. Thereby, it is possible to effectively improve the holding characteristics of the TFT 30.

Here, the capacitor electrode 71 is directly formed on the surface of the element substrate 10 together with the scan line 11, a portion of the data line 6 and a portion of the relay layer 8. That is, while the underlying insulation film 12 is not formed in the aforementioned region, the capacitor electrode is slightly or hardly influenced even by exposure to the impurities or the charges and the like from the element substrate 10 and thus no problem occurs. Since the underlying insulation film 12 does not need to be formed over the entire surface of the element substrate 10 even in this region, it is possible to reduce the amount of material for forming the underlying insulation film 12, to meet demands for resource saving and cost reduction, and to effectively reduce flexure of the element substrate 12 which is generated when the underlying insulation film 12 is formed over the entire surface of the element substrate 10 as well.

The same material and film thickness as those of the first embodiment can be applied to each of the layers constituting the second embodiment.

Manufacturing Method

Reference is made to FIG. 7 to describe a method of manufacturing an active matrix substrate included in the electrophoretic display panel according to the above-mentioned embodiments. Meanwhile, the active matrix substrate according to the embodiments includes the element substrate 10 and the laminated structure on the element substrate 10.

FIG. 7 is a process cross-sectional view sequentially illustrating an example of a method of manufacturing the active matrix substrate according to the first embodiment.

First, a film substrate formed using polyethylene terephthalate (PET) having a thickness of 0.5 mm as a material is prepared as the element substrate 10. Meanwhile, a material of the element substrate 10 includes, for example, polyether sulfone (PES), polyetherimide, polyether ketone, polyphenylene sulfide, polyarylate, polyimide, polycarbonate (PC), aromatic polyester (liquid crystal polymer), cellulose triacetate (TAC), cellulose acetate propionate (CAP), and the like, and an organic insulating substrate may be used as the element substrate 10. Particularly, when the organic insulating substrate is adopted as the element substrate 10, it is possible to contribute to the weight reduction or the improvement in flexibility of the electrophoretic display panel and thus this is preferable. In addition, an inorganic insulating substrate such as glass, silicon and a metallic thin plate may be used as the element substrate 10.

Figure 7A:
FIGS. 7A to 7F are process cross-sectional views illustrating a method of manufacturing an active matrix substrate according to the first embodiment.

Next, as shown in FIG. 7A, the underlying insulation film 12 is formed on the element substrate 10, made of polyimide, having a thickness of 100 nm in an island shape (that is, not over the entire surface of the element substrate 10, but partially in one predefined region). Here, the underlying insulation film 12 is formed by, for example, an application method such as an ink jet method. Meanwhile, these method of forming the insulation film may include, for example, various types of printing methods such as screen printing, offset printing, and gravure printing, a bar coating method capable of partially forming an insulation film within a specific region, an application method like a wet method such as a spraying method, and various types of methods, such as a method of applying film-forming gas to a specific region, capable of partially forming a film in a specific region. That is, the method of forming the underlying insulation film 12 is not limited at all, insofar as it is a method capable of directly forming the underlying insulation film in one region on the element substrate 10 eventually.

In addition, when the underlying insulation film 12 is formed on the element substrate 10 using such methods, it is possible to effectively suppress flexure (that is, structural distortion) in the completed active matrix substrate, compared to the case where one insulation film formed over the entire surface of the substrate is formed by patterning.

In addition, it is possible to lessen the amount of material required at the time of forming the underlying insulation film 12, by adopting such methods of forming the insulation film. In other words, when these underlying insulation films 12 are formed by patterning, they are required to be formed on the entire surface of the element substrate 10 once, and thus the film to be removed by patterning becomes useless. On the other hand, the forming methods adopted in the above-mentioned embodiments, it is possible to directly form the film only in a region in which the underlying insulation film 12 is required to be formed. For this reason, there exists no portion wasted at the time of forming the underlying insulation film 12. As a result, it is possible to considerably lessen the amount of material required at the time of forming the underlying insulation film 12, and to manufacture the active matrix substrate which meets demands for resource saving and cost reduction.

Here, the region in which the underlying insulation film 12 is formed may have a wider region than the region in which the TFT 30 is formed by the post-process. It is possible to effectively prevent the TFT 30 from being exposed to the impurities, the charges and the like from the element substrate 10 side, by forming the underlying insulation film 12 like this.

As a material of the underlying insulation film 12, for example, an organic insulating material or an inorganic material such as a silicon nitride film, in addition to the above-mentioned polyimide, may be adopted. In particular, when a material of the underlying insulation film 12 is applied to the element substrate 10, viscosity of the material may be set to be small. When the material is applied onto the element substrate 10 by setting viscosity of the material like this, the material can be spontaneously formed so that in the surface of the material, the edge thereof is thicker than the central portion thereof (that is, in a mortar shape of which the central portion is concave). When film formation is performed by, for example, an application or printing method such as an ink jet method using a solution, there occurs a phenomenon that with drying of the applied film, the film material is collected at the edge of the film, and the center thereof becomes thin. This is particularly conspicuous at time of using a low-viscosity solution. This is conspicuous at 100 cps or less, particularly 10 cps or less. The thickness ratios of the center to the edge at 100 cps and 10 cps when polyimide dissolved in γ butyl lactone is applied by the ink jet method to a diameter of 50 μm are 80% and 50%, respectively. Even in a method of applying film-forming gas to the substrate and forming a film, it is possible to make the center concave by concentrating gas distribution on the film-forming region edge.

Figure 7B:
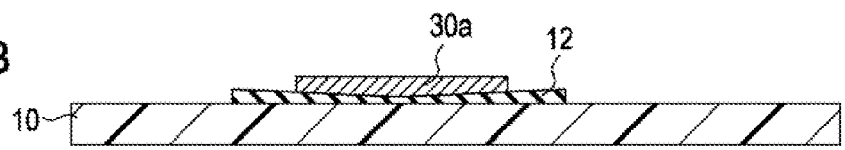

Subsequently, as shown in FIG. 7B, the semiconductor film for forming the semiconductor layer 30a made of pentacene of 50 nm is formed inside the underlying film 12 by the ink jet method.

Here, since the surface of the underlying insulation film 12 formed previously is concaved in a mortar shape, the semiconductor layer 30 formed on the upper layer side is not deviated from a position shown in FIG. 7B, and is stably disposed on the underlying insulation film 12. In other words, supposing that the surface of the underlying insulation film 12 is flatly formed, there may be a concern that the semiconductor layer 30a formed by patterning is easily deviated from the upper side of the underlying insulation film 12. On the other hand, in the embodiment, since the surface of the underlying insulation film 12 is concaved, the semiconductor layer 30a is substantially fixed so as to fit into the concave portion. For this reason, the semiconductor layer 30a is stably disposed on the underlying insulation film 12 even after it is patterned. As a result, since the position of the semiconductor layer 30a on the element substrate 10 can be controlled with a good degree of accuracy, it is possible to form the high-grade TFT 30 on the element substrate 10.

Figure 7C:
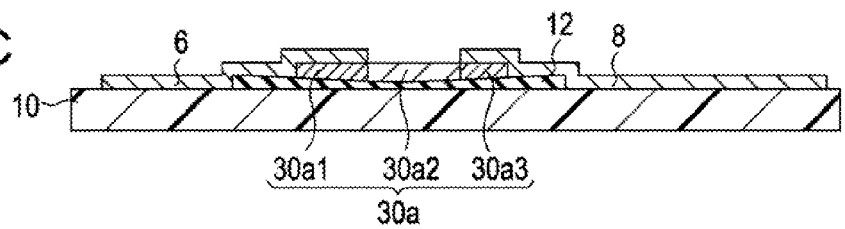

Subsequently, the data line 6 and the relay layer 8, made of gold (Au) having a thickness of 100 nm are respectively formed so as to be electrically connected to the source region 30a1 and the drain region 30a3 of the semiconductor layer 30a (see FIG. 7C). The data line 6 and the relay layer 8, for example, may be formed at the same occasion by patterning a conductive film, made of Au, formed over the entire surface of the element substrate 10 through etching and the like.

It is known that when an organic semiconductor material such as pentacene is used in the semiconductor layer, the source region 30a1 and the drain region 30a2 are spontaneously formed in the semiconductor layer 30a which comes into contact with the data line 6 and the relay layer 8. It is not necessary to perform introduction of the impurities, and the like. This can be said that when the Fermi levels of the semiconductor material and the metal carriers are approximately identical with each other, the charges flow spontaneously.

In addition, the conductive films such as the data line 6 and the relay layer 8 may be also formed by, for example, an application method such as an ink jet method, in the same way as the above-mentioned underlying insulation film 12. In this case, since no useless material occurs by excluding the material in the forming process as in the case where it is formed by patterning, this can contribute to resource saving and cost reduction.

Here, a portion of the data line 6 and the relay layer 8 is directly formed on the element substrate 10 (that is, with the underlying film 12 not being interposed between the element substrate 10 and them). Since the data line 6 and relay layer 8 are slightly or hardly influenced by exposure to the impurities, the charges and the like from the element substrate 10 side with the underlying insulation film 12 not being interposed between the element substrate 10 and them, there is no problem even when the data line and the relay layer are formed on the element substrate 10, with the underlying insulation film 12 not being interposed therebetween in this manner.

Figure 7D:
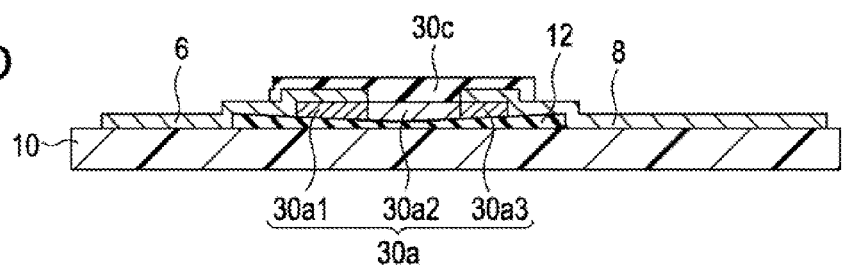
Figure 7E:
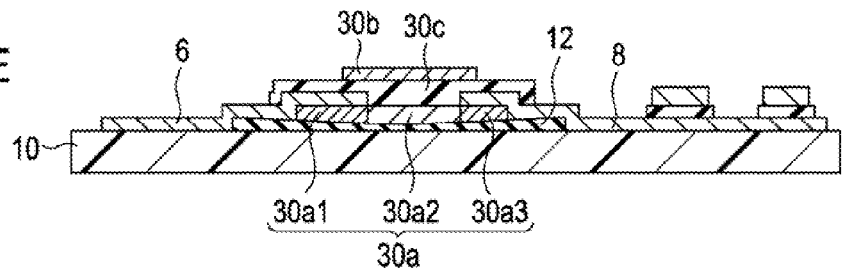

Subsequently, the gate insulating film 30c, made of polyimide, having a thickness of 200 nm is formed on the semiconductor layer 30a, the data line 6 and the relay layer 8 (see FIG. 7D). Here, since the gate insulating film 30c prevents the gate electrode 30b to be formed next from being electrically shorted to the semiconductor layer 30a, the data line 6 and the relay layer 8, it may be formed over a region wider than the semiconductor layer 30a, in a plan view of the element substrate 10.

Here, the gate insulating film 30c is also formed in an island shape by, for example, an application method such as an ink jet method, in the same way as the underlying insulation film 12. It is possible to considerably lessen the amount of material for forming the gate insulating film 30c and to meet demands for resource saving and cost reduction, by forming the gate insulating film 30c in an island shape, in a limited way, not over the entire surface of the element substrate 10, but in an essential region in this manner.

The TFT 30 is completed on the element substrate 10 by forming the gate electrode 30b, made of aluminum (Al), having a thickness of 100 nm on the gate insulating film 30c. The gate electrode 30b is created by forming an Al film over the entire surface thereof through a sputtering method, and by patterning it through a photo-etching method (sees FIG. 7E).

Next, the interlayer insulating film 31, made of acryl, having a thickness of 1 μm is formed on the data line 6, and the capacitor insulating film 72, made of polyimide, having a thickness of 200 nm is formed on the relay layer 8. After that, the scan line 11 is formed on the interlayer insulating film 31. Simultaneously, the capacitor electrode 71 is also formed on the relay layer 8 (see FIG. 7F). The interlayer insulating film 31 and the capacitor insulating film 72 are formed by an ink jet method, but may be formed by an application method, a printing method and the like other than this.

Figure 7F:
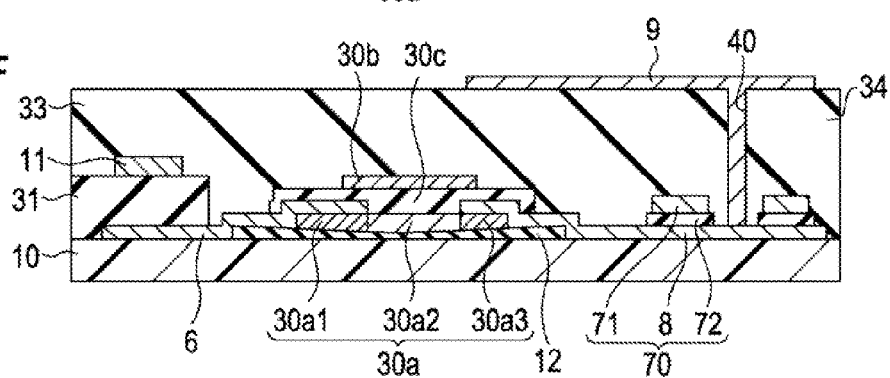

The pixel electrode 9, made of ITO, having a thickness of 50 nm is formed on the interlayer insulating films 33 and 34, made of photosensitive acryl, having a thickness of 1 μm (see FIG. 7F).

The contact hole 40 is also formed in the interlayer insulating films 33 and 34 by applying photosensitive acryl by a spin coating method and exposing and developing it. In addition, the interlayer insulating film 33 and 34 may be formed without forming the interlayer insulating film material in the region in which the contact hole 40 is formed by an application method such as an ink jet method or a printing method. In this case, the contact hole is formed spontaneously.

The pixel electrode 9 is formed by the same method as forming the gate electrode 30c.

It is possible to manufacture the active matrix substrate according to the first embodiment by forming the laminated structure on the element substrate 10 through each of the processes described above.

To describe further, insofar as not only various types of insulation film such as the underlying insulation film 12, the interlayer insulating film 31, the gate insulating film 30c and the capacitor insulating film 72, but also the laminated structure formed on the element substrate 10 mentioned above can be formed by an application method such as an ink jet method or a printing method, they may be formed by using the aforementioned application method. In this case, it is possible to considerably lessen the amount of various types of materials, compared to the case where each laminated structure is formed by patterning, and to thereby further meet demands for resource saving and cost reduction.

Meanwhile, the electrophoretic display panel according to the second embodiment mentioned above can be manufactured by the same processes except that the order of forming the components of the TFT 30, that is, the gate electrode 30b, the gate insulating film 30c and the semiconductor layer 30a is different.

It is also possible to use the same material and film thickness as shown in the first embodiment in the manufacturing method.

Electronic Device

Next, an electronic device to which the above-mentioned electrophoretic display device is applied will be described with reference to FIGS. 8 and 9. Hereinafter, the case where the above-mentioned electrophoretic display device is applied to electronic paper and an electronic notebook is taken as example.

Figure 8:
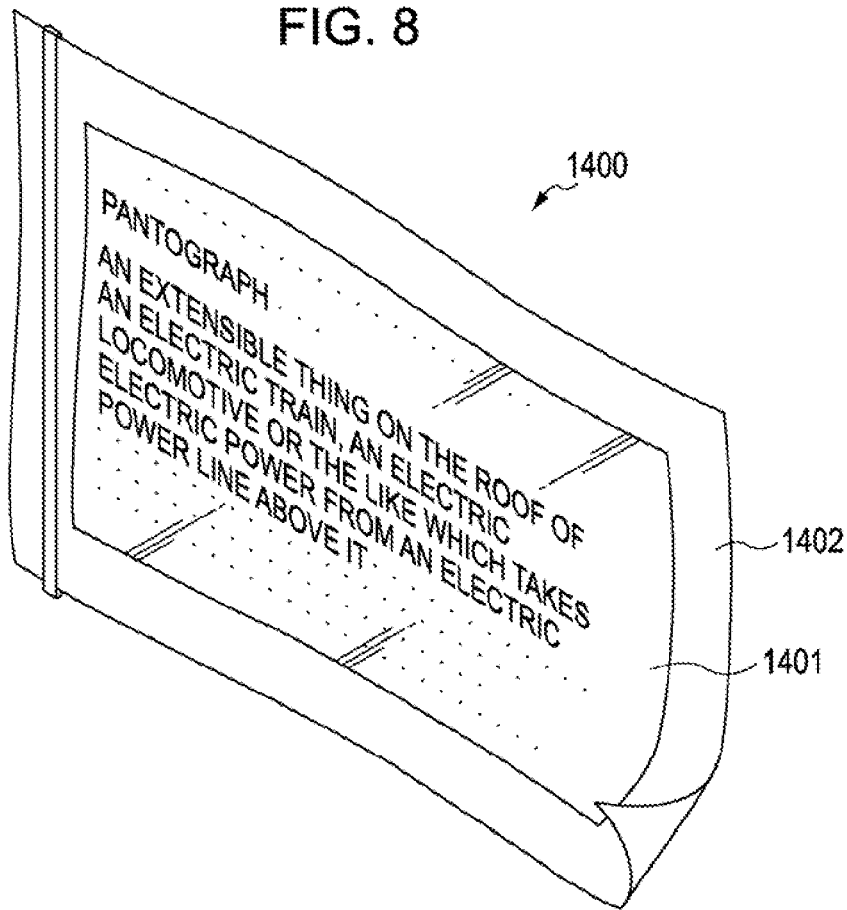
FIG. 8 is a perspective view illustrating the configuration of an electronic paper which is an example of an electronic device to which an electrophoretic display device is applied.

FIG. 8 is a perspective view illustrating the configuration of electronic paper 1400.

As shown in FIG. 8, the electronic paper 1400 includes the electrophoretic display device according to the above-mentioned embodiments as a display portion 1401. The electronic paper 1400 has flexibility, and includes a body 1402 formed of a rewritable sheet having the same texture and pliability as paper of the related art.

Figure 9:
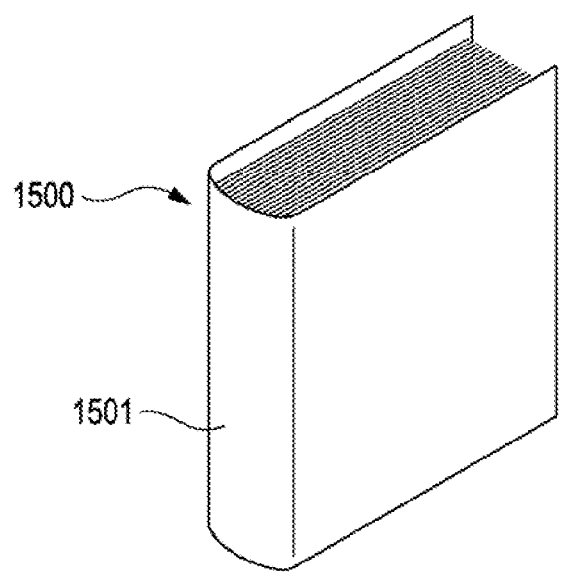
FIG. 9 is a perspective view illustrating the configuration of an electronic notebook which is an example of the electronic device to which the electrophoretic display device is applied.

FIG. 9 is a perspective view illustrating the configuration of an electronic notebook 1500.

As shown in FIG. 9, the electronic notebook 1500 is configured such that a plurality of sheets of the electronic paper 1400 shown in FIG. 8 is bound up and interposed in a cover 1501. The cover 1501 includes, for example, a display data input unit (not shown) for inputting display data sent from an external apparatus. Thereby, it is possible to change or update display contents in response to the display data in a state where a plurality of sheets of electronic paper is bound up in the cover.

The electronic paper 1400 and the electronic notebook 1500 mentioned above include the electrophoretic display device according to the above-mentioned embodiment, and therefore a high-quality image display can be performed with resource saving and cost reduction.

Meanwhile, in addition to these, the electrophoretic display device according to the above-mentioned embodiments can be applied to a display portion of an electronic device such as a wristwatch, a cellular phone, and a portable audio device.

Meanwhile, the invention can also be applied to a liquid crystal display (LCD), a plasma display (PDP), an electrolysis emission display (FED, SED), an organic EL (electroluminescence) display, a digital micro mirror device (DMD), an electrochromic display, an electro-wetting display, and the like, in addition to the electrophoretic display panel described in the above-mentioned embodiments.

The invention is not limited to the above-described embodiment, but may be appropriately modified without departing from the gist or spirit of the invention understandable from claims and the entire specification. A substrate for a semiconductor device, a method of manufacturing the same, a semiconductor device, and an electronic device made by these modifications are also included in the technical scope of the invention.

The entire disclosure of Japanese Patent Application No. 2009-259954, filed Nov. 13, 2009 is expressly incorporated by reference herein.

What is claimed is:

1. A semiconductor device substrate comprising:
   a substrate;
   a transistor, formed on the substrate, that includes a semiconductor layer, and a gate electrode disposed so as to be opposed to the semiconductor layer with a gate insulating film interposed therebetween; and
   an underlying film disposed below the semiconductor layer, as an underlayer of the transistor, and formed in an island shape so as to at least partially overlap the semiconductor layer, in a plan view of the substrate,
   wherein the underlying film is formed so that the central portion thereof is thinner than the edge thereof, in a plan view of the substrate.

2. The semiconductor device substrate according to claim 1, wherein the gate electrode is disposed above the semiconductor layer, and
   the underlying film is formed more widely than the semiconductor layer, in a plan view of the substrate.

3. The semiconductor device substrate according to claim 1, wherein the gate electrode is disposed below the semiconductor layer, and
   the underlying film is formed more widely than the gate electrode, in a plan view of the substrate.

4. A semiconductor device comprising the semiconductor device substrate according to any one of claims 1, 2, and 3.

5. An electronic device comprising the semiconductor device according to claim 4.

6. A method of manufacturing a semiconductor device substrate including a transistor having a semiconductor layer, a gate insulating film and a gate electrode on a substrate, comprising:
   forming the semiconductor layer;
   forming the gate insulating film between the semiconductor layer and the gate electrode;
   forming the gate electrode so as to be opposed to the semiconductor layer with the gate insulating film interposed therebetween; and
   forming an underlying film in an island shape, as an underlayer of the transistor, below the semiconductor layer so as to at least partially overlap the semiconductor layer, in a plan view of the substrate,
   wherein the underlying film is formed so that the central portion thereof is thinner than the edge thereof, in a plan view of the substrate.

7. The method of manufacturing the semiconductor device substrate according to claim 6, wherein the forming of the underlying film includes forming the underlying film by applying an insulating material to a region in which the underlying film on the substrate is formed.

* * * * *